US010998899B2

(12) United States Patent
Wang et al.

(10) Patent No.: US 10,998,899 B2
(45) Date of Patent: May 4, 2021

(54) EMI ENERGY MITIGATION

(71) Applicant: University of Florida Research Foundation, Inc., Gainesville, FL (US)

(72) Inventors: Shuo Wang, Gainesville, FL (US); Hui Zhao, Cambridge (GB); Le Yang, Gainesville, FL (US)

(73) Assignee: University of Florida Research Foundation, Inc., Gainesville, FL (US)

(*) Notice: Subject to any disclaimer, the term of this patent is extended or adjusted under 35 U.S.C. 154(b) by 0 days.

(21) Appl. No.: 16/700,253

(22) Filed: Dec. 2, 2019

(65) Prior Publication Data
US 2020/0106432 A1 Apr. 2, 2020

Related U.S. Application Data

(63) Continuation-in-part of application No. 16/175,219, filed on Oct. 30, 2018, now Pat. No. 10,541,601.

(60) Provisional application No. 62/579,089, filed on Oct. 30, 2017.

(51) Int. Cl.
H03K 17/16 (2006.01)
G06N 3/08 (2006.01)
H03K 5/003 (2006.01)
H03K 3/017 (2006.01)

(52) U.S. Cl.
CPC ............... *H03K 17/16* (2013.01); *G06N 3/08* (2013.01); *H03K 3/017* (2013.01); *H03K 5/003* (2013.01)

(58) Field of Classification Search
None
See application file for complete search history.

(56) References Cited

U.S. PATENT DOCUMENTS

| | | | |
|---|---|---|---|
| 6,128,043 A | 10/2000 | Tulder | |
| 2008/0088350 A1 | 4/2008 | Sohn | |
| 2016/0315540 A1 | 10/2016 | Dilley et al. | |
| 2017/0222571 A1 | 8/2017 | Gonzalez-Espin et al. | |

*Primary Examiner* — Jeffrey A Gblende
(74) *Attorney, Agent, or Firm* — Thomas | Horstemeyer, LLP

(57) ABSTRACT

Various examples related to electromagnetic interference (EMI) energy mitigation techniques are provided. In one example, a method includes determining electromagnetic interference (EMI) spectrum information based upon switching angles of a switching circuit and processing harmonic magnitudes ($C_i$) associated with the switching angles using an artificial neural network to determine adjusted switching angles for the switching circuit; and applying the adjusted switching angles to control the switching circuit thereby reducing generated EMI energy by the switching circuit.

20 Claims, 16 Drawing Sheets

| vector | Sa/Sb/Sc | Vcm |
|---|---|---|
| S0 | 0/0/0 | 0 |
| S1 | 1/0/0 | Vdc/3 |
| S2 | 1/1/0 | Vdc*2/3 |
| S3 | 0/1/0 | Vdc/3 |
| S4 | 0/1/1 | Vdc*2/3 |
| S5 | 0/0/1 | Vdc/3 |
| S6 | 1/0/1 | Vdc*2/3 |
| S7 | 1/1/1 | Vdc |

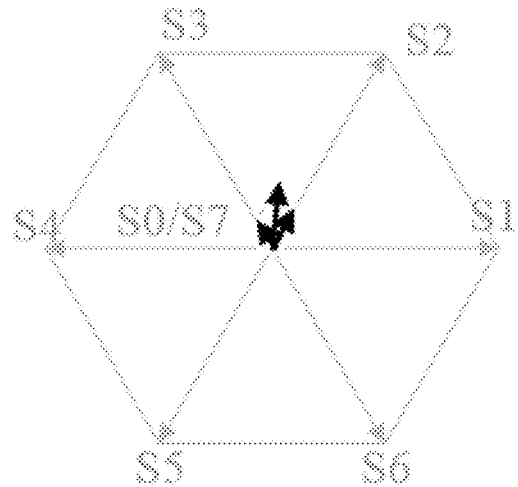
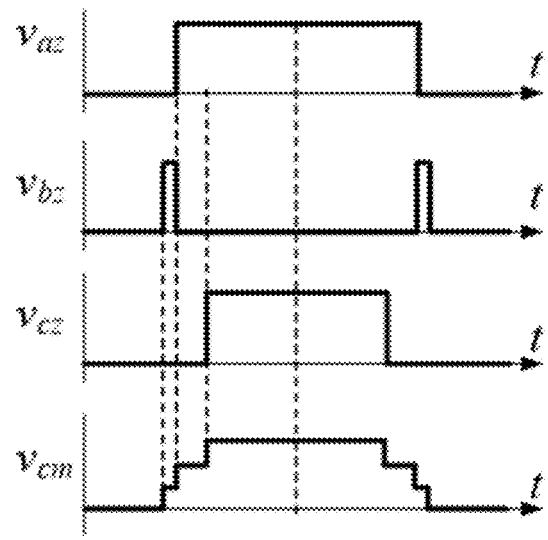
FIG. 2B
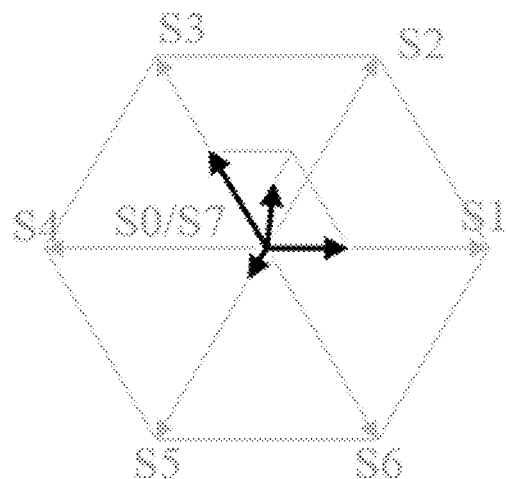
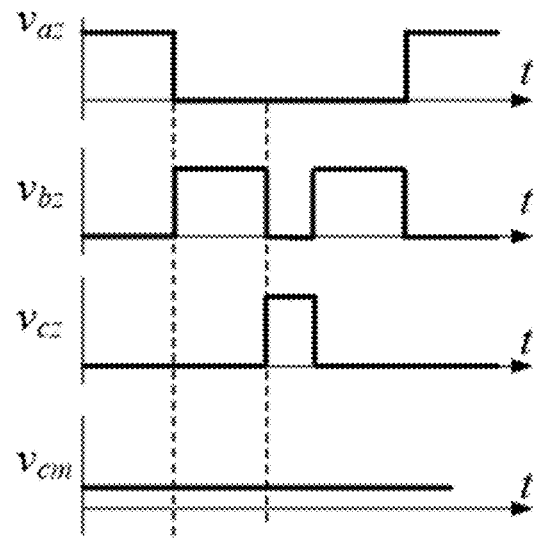
FIG. 2C

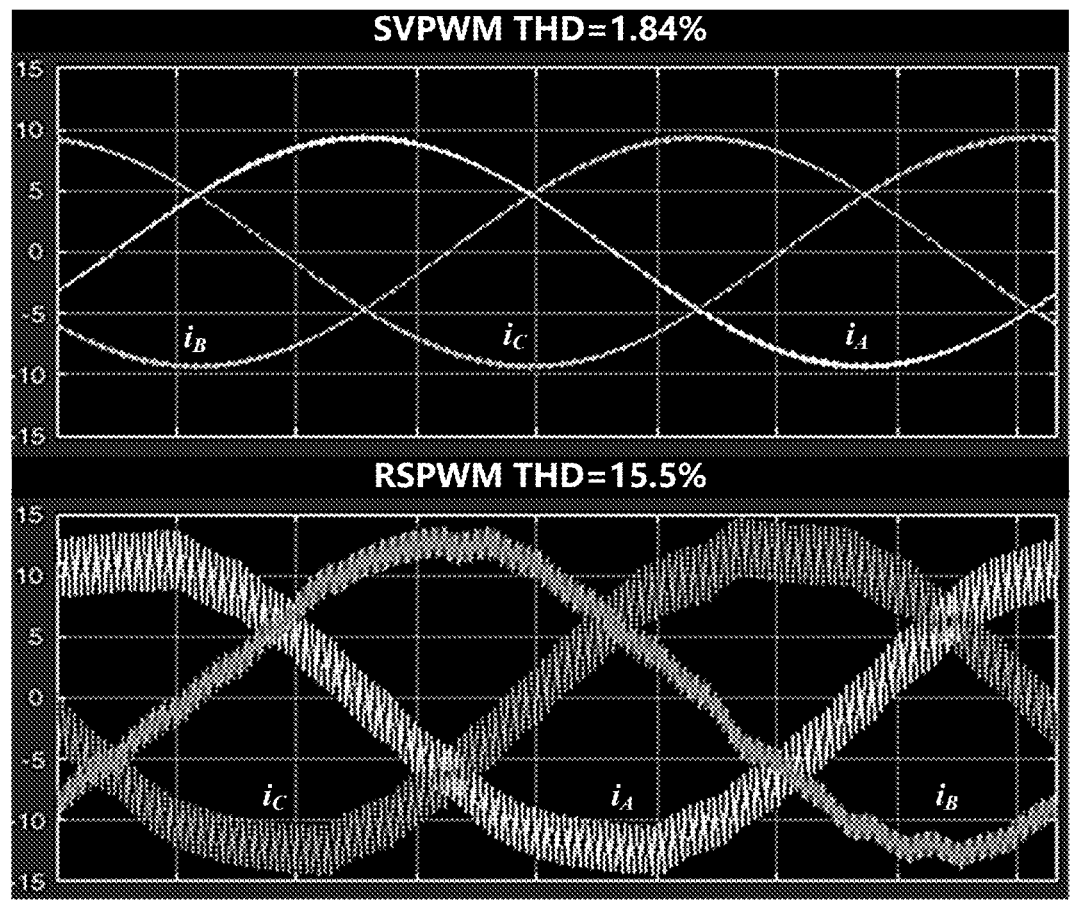
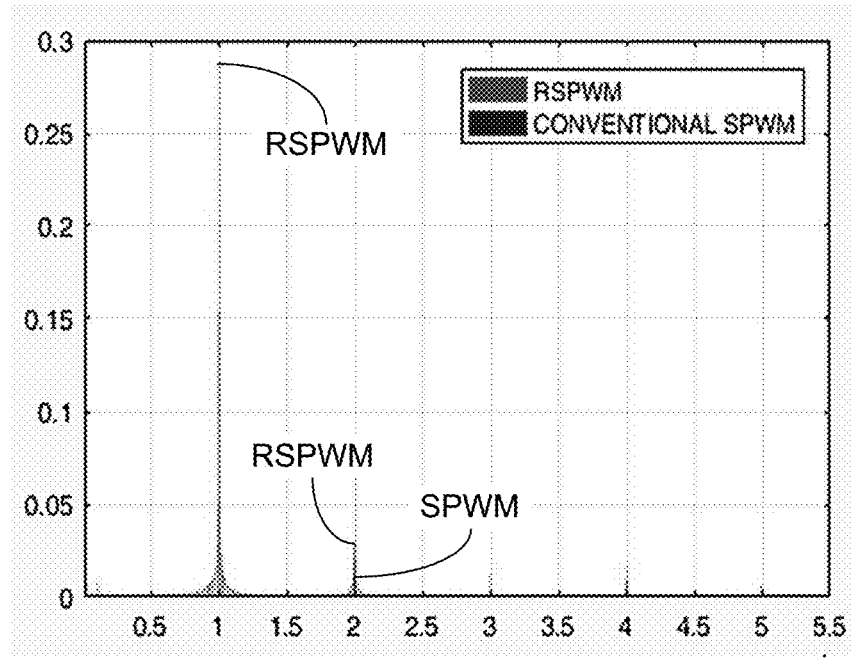
FIG. 2D

US 10,998,899 B2

EMI ENERGY MITIGATION

CROSS REFERENCE TO RELATED APPLICATIONS

This application is a continuation-in-part of co-pending U.S. non-provisional application entitled "EMI Energy Mitigation" having Ser. No. 16/175,219, filed Oct. 30, 2018, which claims the benefit of U.S. provisional application entitled "EMI Energy Mitigation" having Ser. No. 62/579,089, filed Oct. 30, 2017, both of which are hereby incorporated by reference in their entireties.

STATEMENT REGARDING FEDERALLY SPONSORED RESEARCH OR DEVELOPMENT

This invention was made with government support under grant number 1540118 awarded by the National Science Foundation (NSF). The government has certain rights in the invention.

BACKGROUND

Because of the fast transition times of switched devices, higher frequency harmonics are produced that result in electromagnetic interference (EMI). This results in wasted energy and can affect the quality of the signal itself. Energy mitigation of the EMI can result in better performance of the devices and the system as a whole.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 illustrates an example of a three phase inverter/rectifier switching circuit, in accordance with various embodiments of the present disclosure.

FIGS. 2A-2D illustrate space vector pulse width modulation (SPWM or SVPWM) and remote state pulse width modulation (RSPWM) operation of the switching circuit of FIG. 1, in accordance with various embodiments of the present disclosure.

DETAILED DESCRIPTION

Disclosed herein are various examples related to electromagnetic interference (EMI) energy mitigation techniques. By mitigation, the harmonics can be more evenly spread over a large range, allowing the overall EMI energy to be maintained within the EMI standard. The disclosed EMI energy mitigation scheme can be used in power electronics and power converters for, e.g., motor drives, DC/DC power converters, solar panels, and electric vehicles. Proper modulation of the switching can reduce or prevent EMI. Switching is carried out based on an energy perspective. Total energy is related to the duty cycle and DC voltage level.

EMI degrades the system's reliability and shortens the lifespan of components in grid-tied systems such as, e.g., photovoltaic (PV) systems and variable-frequency drive (VFD) systems. Therefore, commercial switching power converters need to comply with the EMI standards before they can be officially sold on the market. EMI noise suppression techniques can be divided into hardware techniques and soft/modulation techniques.

Hardware techniques can reduce the EMI noise by adding passive components in the power electronics system such as passive filters and Wheatstone balance techniques. With appropriate design and parameterization, noise reduction performance can be satisfying in a considered frequency range (without considering the influence of parasitic components). However, added components usually include inductors and capacitors, which can be very bulky in size and increase the cost of the design.

Figures 1, 2A:
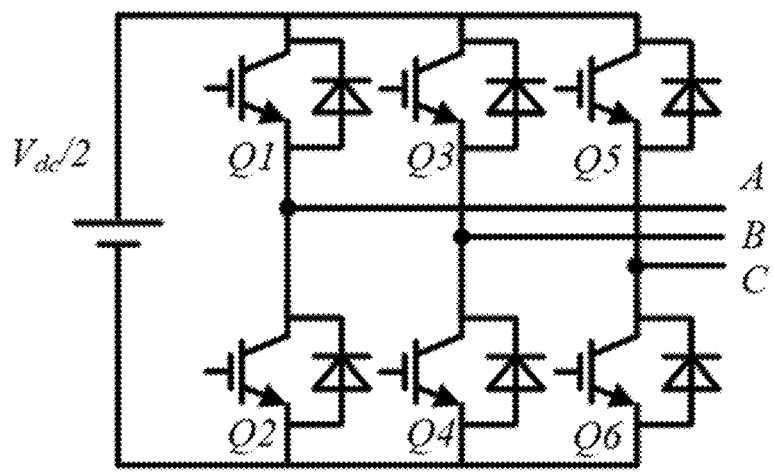

On the other hand, software/modulation techniques can reduce the EMI noise without adding extra components. Since software/modulation techniques are complicated and have limitations in applications, the EMI noise reduction performance can be limited in topologies such as the three phase bridge circuit illustrated in FIG. 1. Conventional space vector pulse width modulation (SPWM or SVPWM) utilizes a vector look up table such as the example in FIG. 2A to determine switching of the three phase bridge circuit. For example, the transient space vector can be generated by adjacent vectors (S3, S2) and zero vectors (S0/S7) as shown in the vector space representation of FIG. 2B. This can result in a large common-mode (CM) voltage ($V_{cm}$), as illustrated in the plot of FIG. 2B.

Remote state pulse width modulation (RSPWM) can eliminate the CM voltage by rearranging the space vectors. With RSPWM, the same vector is generated by non-adjacent vectors (S1, S3 and S5), resulting in a zero $V_{cm}$ as illustrated in FIG. 2C.

FIG. 2D shows an example of the three phase differential mode (DM) current response ($i_A$, $i_B$, $i_C$) using the SPWM and RSPWM techniques, and the DM current spectrum. Even though the CM noise is reduced with RSPWM compared with SPWM, the DM noise compared with SPWM is increased as the current ripples are significantly larger than with SPWM. Also, the modulation index of RSPWM is no longer as large as SPWM.

The disclosed EMI energy mitigation techniques can provide low EMI noise with low cost and easy implementation. The EMI energy mitigation technique is a software/modulation technique which needs no extra passive components. Moreover, compared with exiting soft/modulation techniques, the technique is easy to implement in power electronics control without degrading system's fundamental performance. The disclosed EMI energy mitigation technique can also provide better performance with high switching frequency wide-band gap (WBG) device, such as SiC and GaN devices.

Reducing the total energy while dispersing energy into a trivial region and regions with large attenuation can achieve optimal performance. For example, injecting a DC component in the modulation waveform can change the average duty cycle, thereby reducing the total energy. This can improve both total harmonic distortion (THD) and total demand distortion (TDD). In addition, dispersion of the spectrum into the trivial region can reduce both CM noise and DM noise simultaneously. This can be accomplished through the use of a modulation block to adjust switching angles. Only one current harmonic is allowed within each resolution bandwidth (RBW), and the middle coefficient within each RBW can be weighted to be small.

Figure 3:
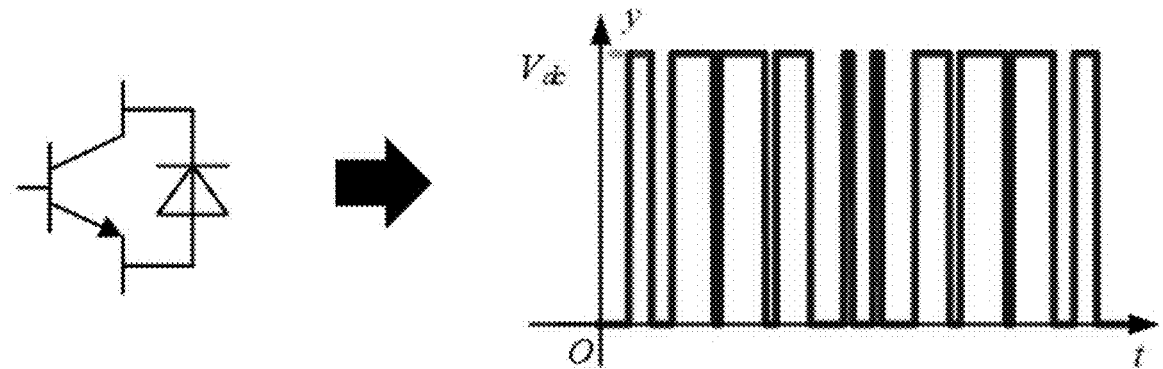
FIG. 3 is a schematic diagram of a semi-conductor switch and an example of a PWM waveform between terminals of the switch, in accordance with various embodiments of the present disclosure.

Harmonic energy is an important factor to evaluate the current quality. Standards such as IEEE Std. 519 take the total harmonic distortion (THD) as one of the major factors to reflect the harmonic quality. Random PWM can decrease the peak value by expanding the harmonic energy within a wide range. But the closed form equation of the harmonic energy has not been derived and it is usually believed that the THD will not be changed by random PWM. Semiconductor switches (MOSFETs, IGBTs, diodes) are the basic components for power conversion. Referring to FIG. 3, shown is a schematic representation of a semi-conductor switch and an example of a PWM waveform between the switch terminals. The voltage across the switch is either 0 or $V_{dc}$ as shown.

The total harmonic energy can be determined using the duty cycle and DC voltage. Assuming the switching sequence repeats itself for every T second, then the time domain waveform u(t) can be expressed in Fourier Series as:

$$u(t) = \frac{1}{2}a_0 + \sum_{m=1}^{\infty}(a_m\cos(m\omega t) + b_m\sin(m\omega t)) \quad (1)$$

$$= \frac{1}{2}a_0 + \sum_{m=1}^{\infty} c_m\cos(m\omega t + \theta_m)$$

The term $1/2 a_0$ can be shifted to the left-hand side (LHS) of equation (1) to obtain:

$$u(t) - \frac{1}{2}a_0 = \sum_{m=1}^{\infty} c_m\cos(m\omega t + \theta_m). \quad (2)$$

The average square of the right-hand side (RHS) of equation (2) is:

$$\frac{1}{T}\int_0^T \left(\sum_{m=1}^{\infty} c_m\cos(m\omega t + \theta_m)\right)^2 dt = \quad (3)$$

$$\frac{1}{T}\int_0^T \sum_{i=1}^{\infty}\sum_{j=1}^{\infty} c_i\cos(i\omega t + \theta_i)c_j\cos(j\omega t + \theta_j)dt =$$

$$\frac{1}{T}\left(\int_0^T \sum_{i=1}^{\infty}(c_i\cos(i\omega t + \theta_i))^2 dt + \int_0^T \sum_{i=1}^{\infty}\sum_{j=1}^{\infty} c_i c_j\cos(i\omega t + \theta_i)\cos(j\omega t + \theta_j)dt\right) = \frac{1}{2}\sum_{m=1}^{\infty} c_m^2$$

As shown in equation (3), the average square of equation (2) is the total energy of any square waveform.

Figure 4:
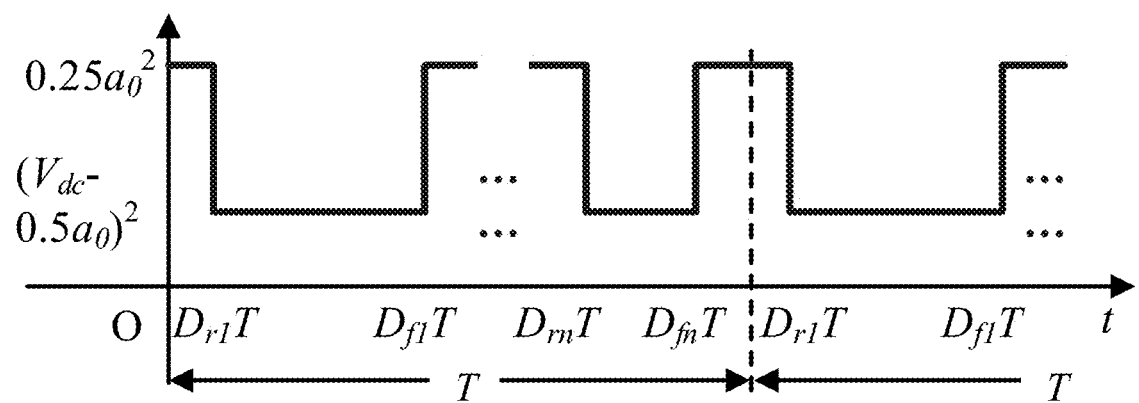
FIG. 4 illustrates a harmonic energy waveform of a single switch, in accordance with various embodiments of the present disclosure.

The square of the LHS of equation (2) is equal to the term of equation (3), and is also the total harmonic energy. The total harmonic energy waveform for a single switch is illustrated in FIG. 4. The average square value of the LHS of equation (2) can be calculated as:

$$\frac{1}{T}\int_0^T \left(u(t) - \frac{1}{2}a_0\right)^2 dt = \overline{D}(1-\overline{D})V_{dc}^2, \quad (4)$$

where $\overline{D}$ is the average duty cycle of the switching frequency, $$\overline{D} = \Sigma_{i=1}^{\infty}(D_{fi} - D_{ri}). \quad (5)$$

Because the average square values of the RHS and LHS of equation (2) should be equal to each other, the total energy ($TENG_{SW}$) can be defined as the variable:

$$TENG_{SW} = \frac{1}{2}\sum_{m=1}^{\infty} c_m^2 = \overline{D}(1-\overline{D})V_{dc}^2, \quad (6)$$

Which represents the total harmonic energy. This evaluation shows that the total harmonic energy is related to duty cycle and DC voltage, and that the total harmonic energy is not related to switching frequency and modulation techniques.

Figure 5:
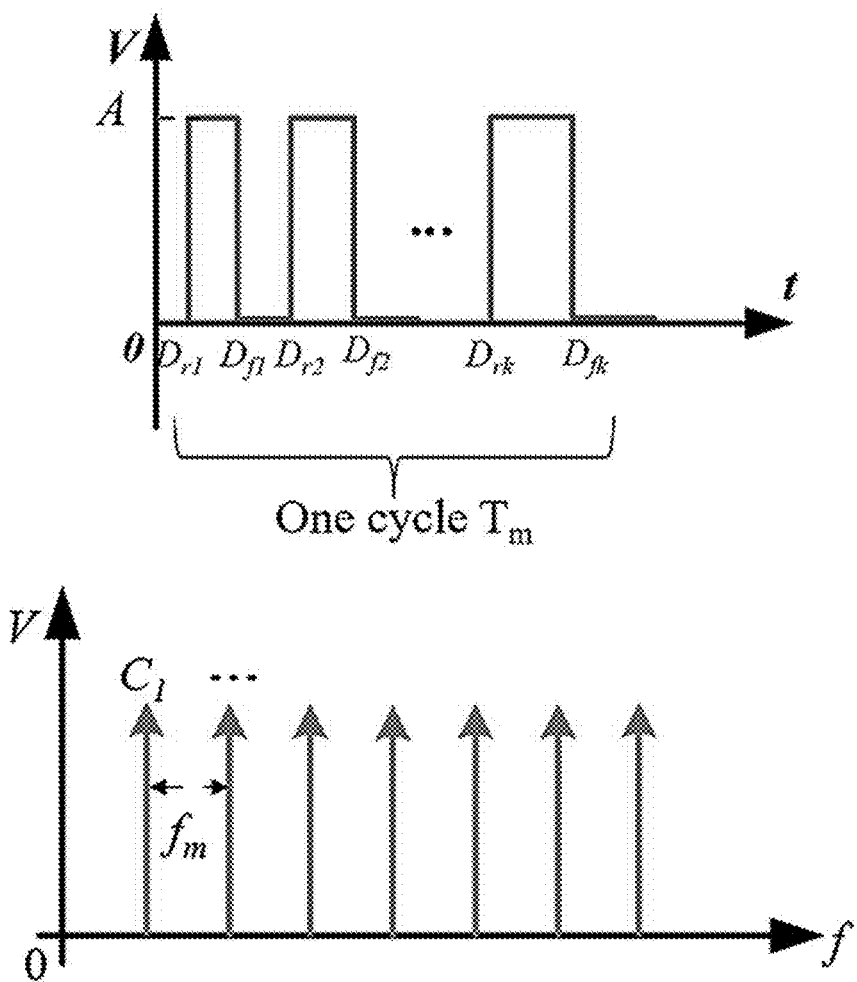
FIG. 5 is a graphical representation of an example of a time domain waveform of a random switching sequence and its spectrum, in accordance with various embodiments of the present disclosure.

The spectrum can be determined using switching angles in the time domain waveform. FIG. 5 illustrates an example of a time domain waveform of a random switching sequence and its spectrum. Consider the time domain waveform of a random switching sequence repeats every period of $T_m = 1/f_m$. There are k switching operations in $T_m$. Each switching operation has a rising time $D_{ri}$ and falling time $D_{fi}$. Based on the Fourier transform, the spectrum magnitude can be calculated as:

$$C_m = j\frac{V_{dc}}{\pi m}\left(\sum e^{-j2\pi m D_{fi}} - \sum e^{-j\pi m D_{ri}}\right), \quad (7)$$

where m is the harmonic order. Equation (7) shows that the spectrum magnitude and distribution can be controlled by each rising and falling time (i.e., the switching angles) of the switching sequence.

Based on the characteristics of the harmonics energy and harmonics magnitude discussed above, the EMI noise can be reduced with the following methods:

Reduce total harmonic energy: Based on equation (6), the total harmonic energy can be reduced by reducing the duty cycle and DC voltage level. When the total harmonic energy is reduced, the EMI noise level will also decrease correspondingly.

Disperse EMI frequency energy into non-EMI frequency ranges: Since the harmonic energy is constant when the duty cycle and DC voltage is determined, if harmonic energy in the EMI frequency range (e.g., above 150 kHz) can be relocated into a non-frequency range, the noise level will decrease in EMI frequency range, thereby satisfying the EMI standards.

Disperse the EMI energy into the region with large attenuation (e.g., with EMI filters): EMI filters are passive circuits that can be added to the system to reduce the EMI noise. The EMI energy can be controlled and rearranged in the stop-band (high attenuation frequency band) of one or more EMI filter. This method can optimize the performance of the EMI filters and help to reduce the number and size of the EMI filters.

Control the EMI noise magnitude in the EMI frequency range: Since the harmonics can be controlled by switching angles as indicated by equation (7), the EMI frequency harmonics can be controlled and limited to magnitudes lower than the EMI standards.

A combination of above listed techniques can achieve reduction or optimal EMI performance for a switching circuit.

Figure 6:
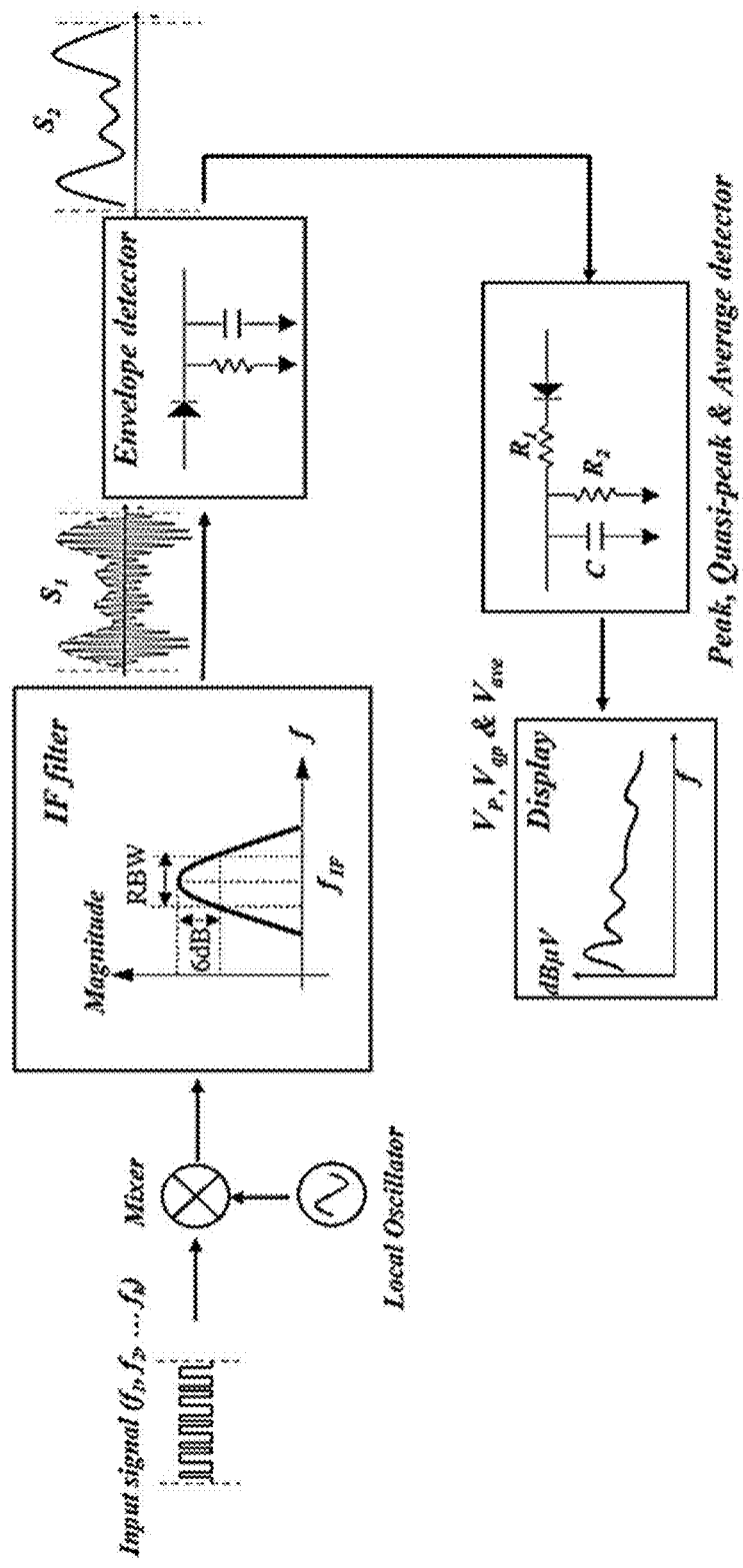
FIG. 6 is a block diagram illustrating an example of a spectrum analyzer that can be used for EMI analysis, in accordance with various embodiments of the present disclosure.

EMI measurement with spectrum analyzers. EMI noise can be measured with spectrum analyzer to evaluate the noise level and compare with EMI standards. FIG. 6 is a block diagram illustrating an example of a spectrum analyzer that can be used for EMI analysis. An input signal is mixed with a signal generated by a local oscillator and passed to an intermediate frequency (IF) filter. The IF filter in the spectrum analyzer measurement can be considered a bandpass filter. The pass-band of the IF filter is referred to as the resolution bandwidth (RBW). An envelope detector processes the filtered signal and sends its output to a peak, quasi-peak and average detector where signals are generated for presentation. If multiple frequency components are located within the RBW, the measurement results will be larger than that when only a single frequency component is present in RBW. By minimizing the frequency components in the RBW, the measured results can be reduced or minimized.

Figure 7:
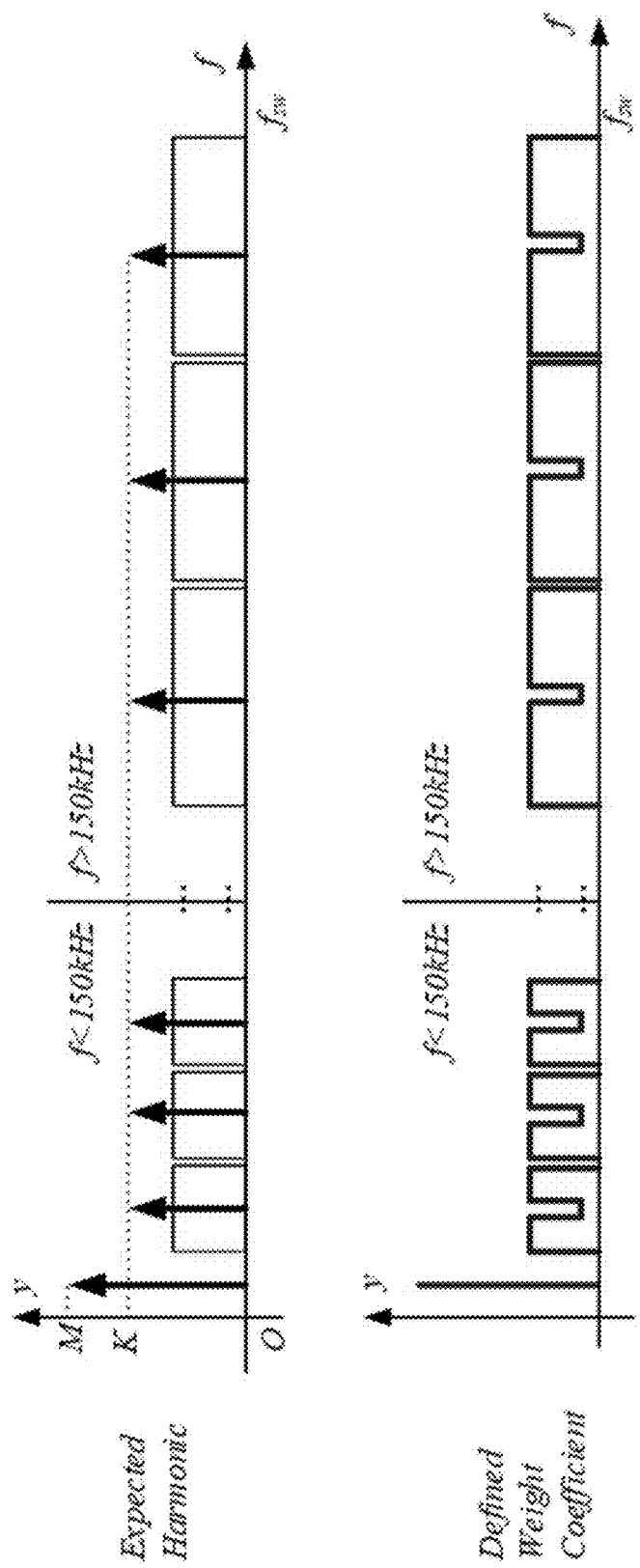
FIGS. 7A and 7B are examples of an expected harmonic distribution and the weight coefficients in terms of frequency, in accordance with various embodiments of the present disclosure.

EMI energy dispersion. In order to achieve improved EMI energy dispersion performance, by controlling the switching angles, this technique allows only one frequency component located in RBW. Referring to FIG. 7A, shown is an example of the expected harmonic distribution. The blocks defined by the solid lines represent the RBWs. The EMI standard regulates the difference RBWs in different frequency ranges. Below 150 kHz, the RBW is smaller than those RBW located above 150 kHz. The arrows represent the spectrum distribution of the disclosed EMI energy mitigation technique, with only one frequency component located in an RBW. The expected harmonic distribution is that fundamental component is unchanged (equal to M). Below 150 kHz, the spectrum is more concentrated since the RBWs are smaller. In contrast, above 150 kHz the spectrum is less concentrated with larger RBWs. The magnitude of each harmonic component can be determined by equation (7). This means that by controlling the switching angles (the rising and falling times) of the PWM, the spectrum distribution and magnitude can be controlled. Considering the EMI standard and measurement equipment, an optimal harmonic distribution may be achieved.

FIG. 7B graphically illustrates the weight coefficients in terms of frequency. The fundamental reference harmonic $C_1^*=M$ has the largest magnitude, and within each RBW the middle coefficient is small. It should be noted that FIG. 7B is an example illustrating that the harmonic can be controlled to be lower than pre-set values. In practice, a pre-set value K can be a function of frequency (or another objective function) based on the EMI standards and/or different applications. For RBWs below 150 kHz, the coefficient may be zero. As long as the peak value can meet the standard requirement, the converter can be considered EMI free.

Figure 8:
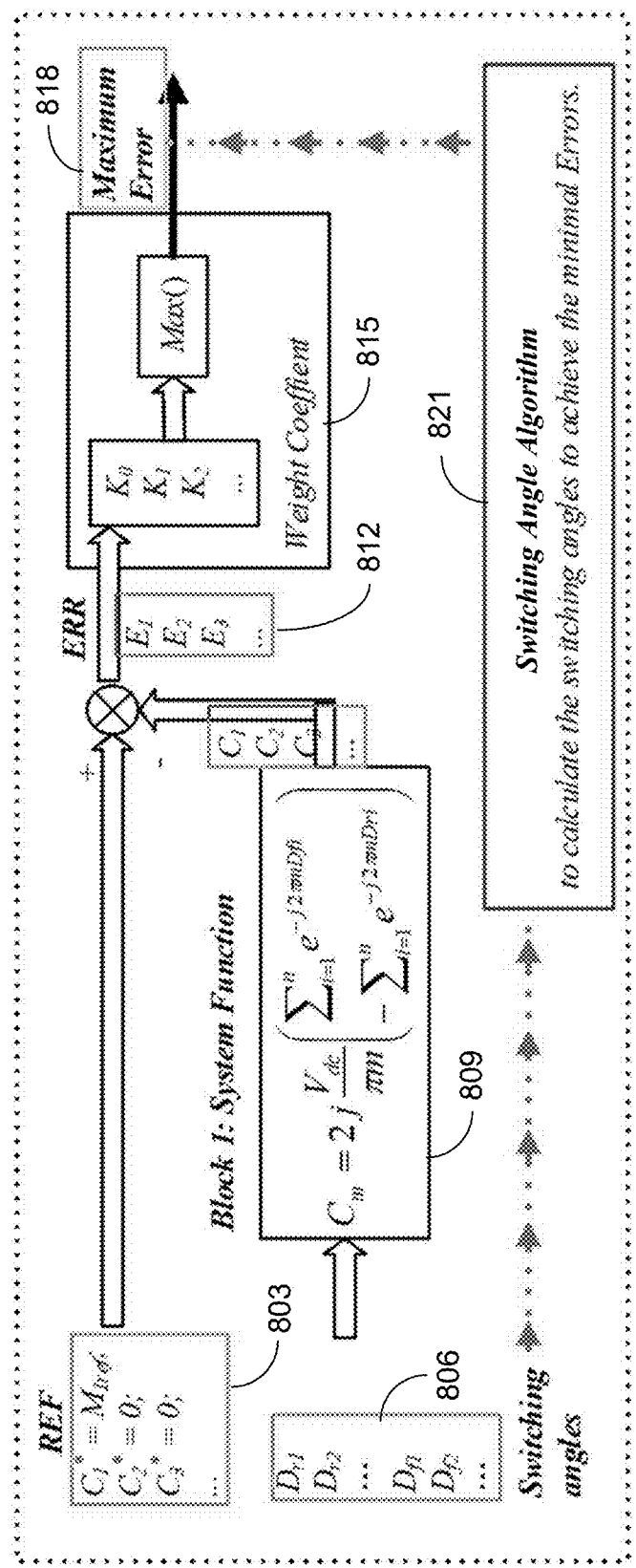
FIG. 8 is a flow diagram illustrating an example of an EMI energy mitigation technique to obtain switching angles to achieve minimal errors for EMI reduction, in accordance with various embodiments of the present disclosure.

The switching angles can be obtained with the method illustrated in FIG. 8. The reference harmonic magnitudes C1* 803 can be designed to satisfy fundamental performance and EMI standards. Initial conditions of the switching angles $D_{ri}$ and $D_{fi}$ 806 can be used to determine the EMI spectrum harmonics magnitude and distribution $C_i$ 809. The errors $E_i$ 812 between reference harmonic magnitudes $C_i^*$ and determined harmonic magnitudes $C_i$ can then be obtained. Weight coefficients $K_i$ 815 are then applied on these errors 812. The weight coefficients 815 are a list of weighting constants to determine the importance of each error 812 to, e.g., meet a desired harmonic quality standard (e.g., IEEE Std. 519). By adjusting one or more coefficient 815, the expected output result can be controlled.

The maximum error 818 with the weight coefficients 815 can then be compared with a preset acceptable tolerance value. If this error is larger than the preset tolerance, another set of switching angles can be generated using a switching angle algorithm 821. The objective function can be the maximum error among the weighted errors $K_iE_i$ in FIG. 8. A genetic algorithm or a swarm optimization can be applied to find a set of switching angles that makes the maximum error less than the tolerance. First, the algorithm starts with a set of random switching angles. It can then generate a new set of switching angles (next generation) based on each of the angles in the current set (current generation). Generation of the new angles can be performed using the following steps:

(a) Based on the output of the current generation, each of the individuals can be scored with a fitness value.
(b) Individuals that have better fitness values are selected as parents. Different selection functions can be defined to make the decision. Other individuals will be abandoned.
(c) The next generation will be produced with the current parents. New generations can be produced either by making random changes to a single parent (mutation) or by combining the vector entries of a pair of parents (crossover).

(d) The current generation can then be replaced by the next generation. The output will "evolve" to achieve a reduced or minimum value of the objective function.

This process can be iteratively repeated until the maximum error with the weight coefficient values is within the preset tolerance threshold. In this way, the switching angles can be obtained to have a similar spectrum magnitude and distribution as the reference harmonic magnitudes 803 within acceptable tolerances.

Figure 9A:
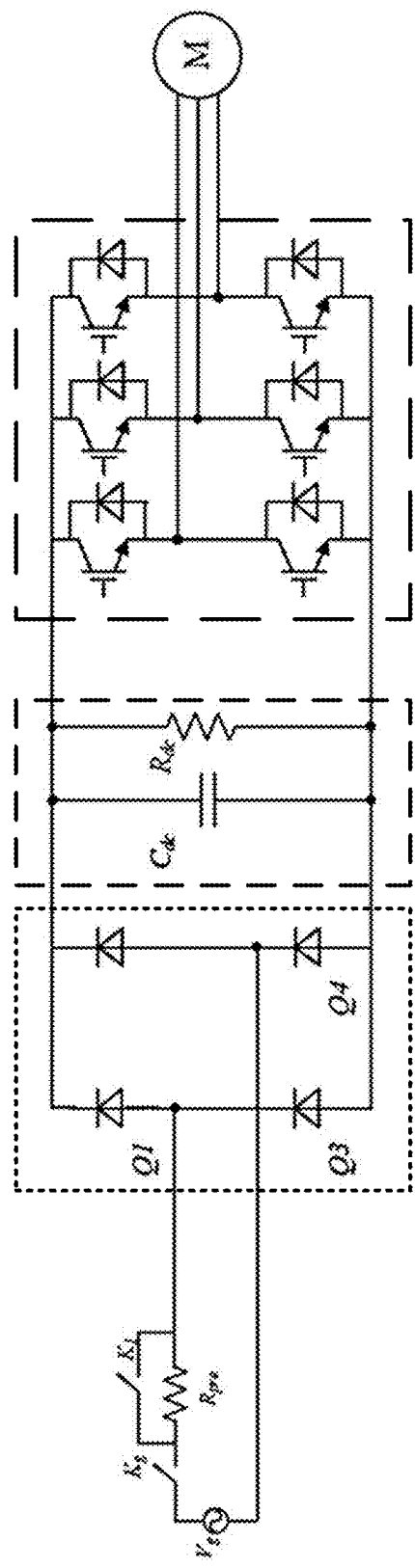
FIGS. 9A and 9B illustrate a three phase switching circuit used for experimental testing, in accordance with various embodiments of the present disclosure.
Figure 9B:
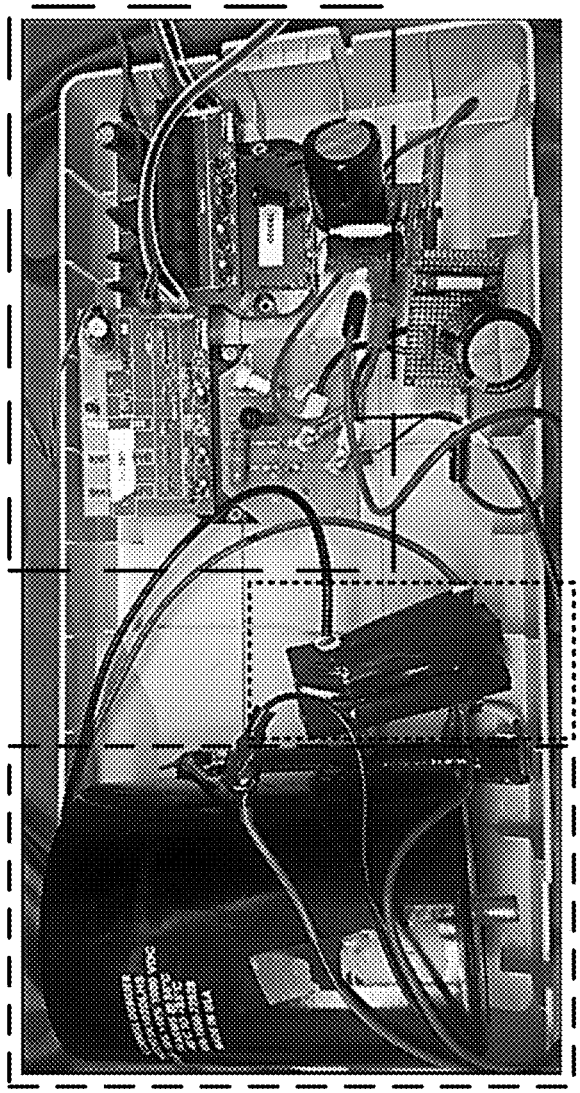

FIG. 9A shows a schematic diagram illustrating the topology of the three phase rectifier/inverter circuit used to validate the simulation results, and FIG. 9B is an image of the implemented device. Controller circuitry including a processor and memory, and drive circuitry for the switches (e.g., MOSFETs, IGBTs, diodes) can control switching operation of the rectifier/inverter circuit. The disclosed EMI energy mitigation technique was verified using the three-phase inverter system in FIGS. 9A and 9B. It should be noted that the applications of the disclosed EMI energy mitigation technique are not limited to an inverter system, but can be applied to other switching topologies as can be understood. Since the basic principle of this technique is to reduce and rearrange the harmonic energy of the energy sources of the power electronic converters, the EMI energy mitigation technique can be applied in all power electronics system.

Figure 10A:
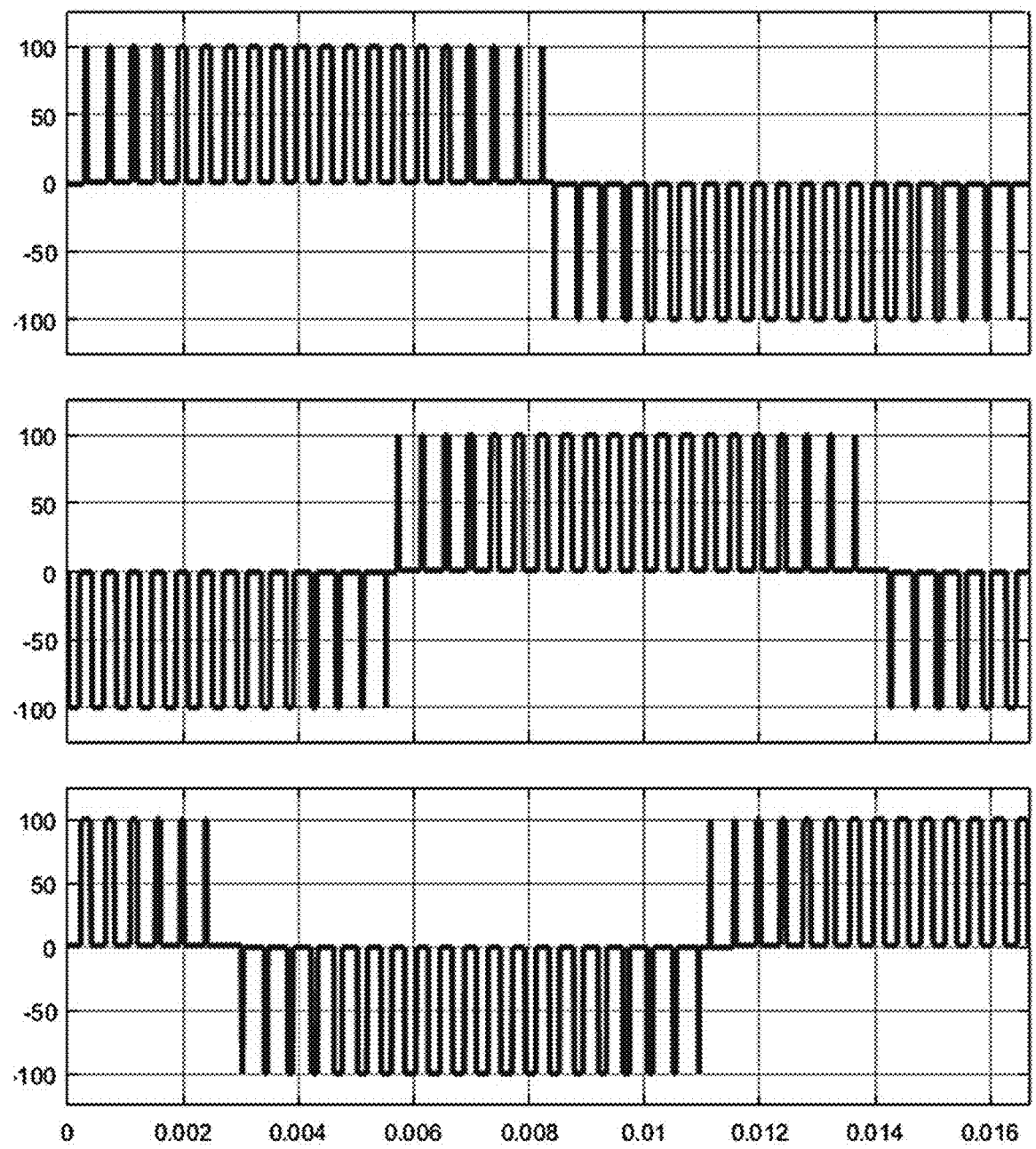
FIGS. 10A and 10B illustrate time domain waveforms for conventional SPWM and the EMI energy mitigation technique of FIG. 8, in accordance with various embodiments of the present disclosure.
Figure 10B:
Figure 11A:
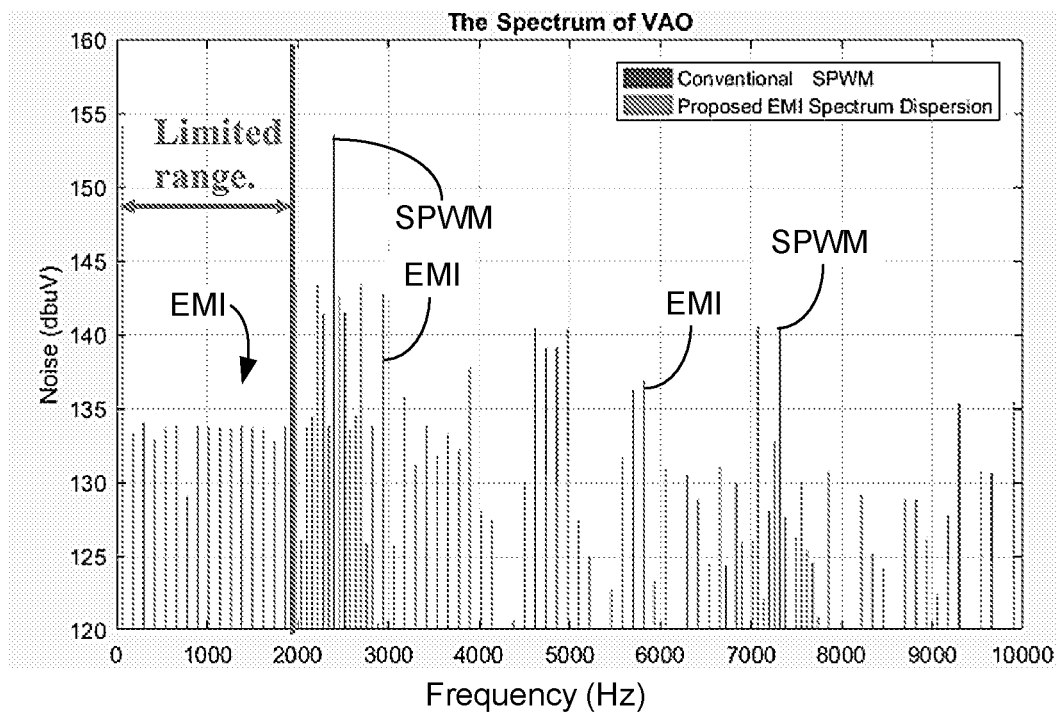
FIGS. 11A, 11B and 12 illustrate examples of simulation and test results utilizing the EMI energy mitigation technique of FIG. 8, in accordance with various embodiments of the present disclosure.
Figure 11B:
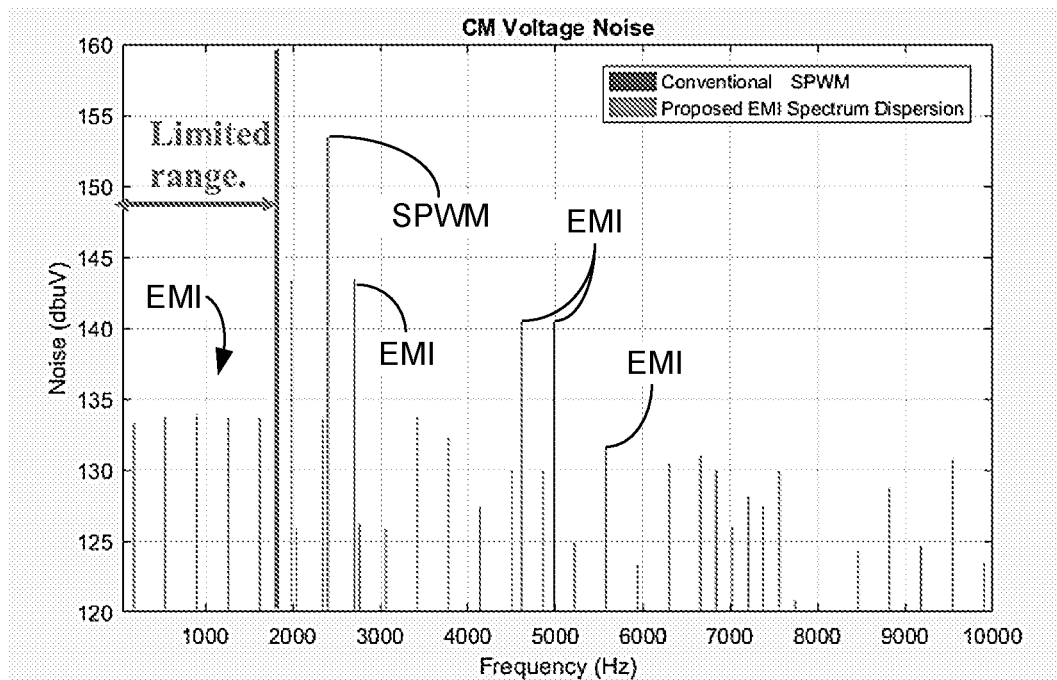

Three phase time domain waveform comparison between conventional SPWM and the disclosed EMI energy mitigation technique is shown in FIGS. 10A and 10B, respectively. The simulation results of an example of harmonics dispersed in the lower frequency range and controlled to a constant value are shown in FIGS. 12A and 12B. As shown, the energy of the spectrum of conventional SPWM is concentrated around the switching frequency harmonics. In the dispersed spectrum with the EMI energy mitigation technique can be used to control the harmonic magnitude and distribution. The original harmonic energy was dispersed in the limited range. Since the harmonic energy is constant as discussed above, in the higher frequency range (above the limited range), the magnitude of the harmonics is significantly reduced.

Figure 12:
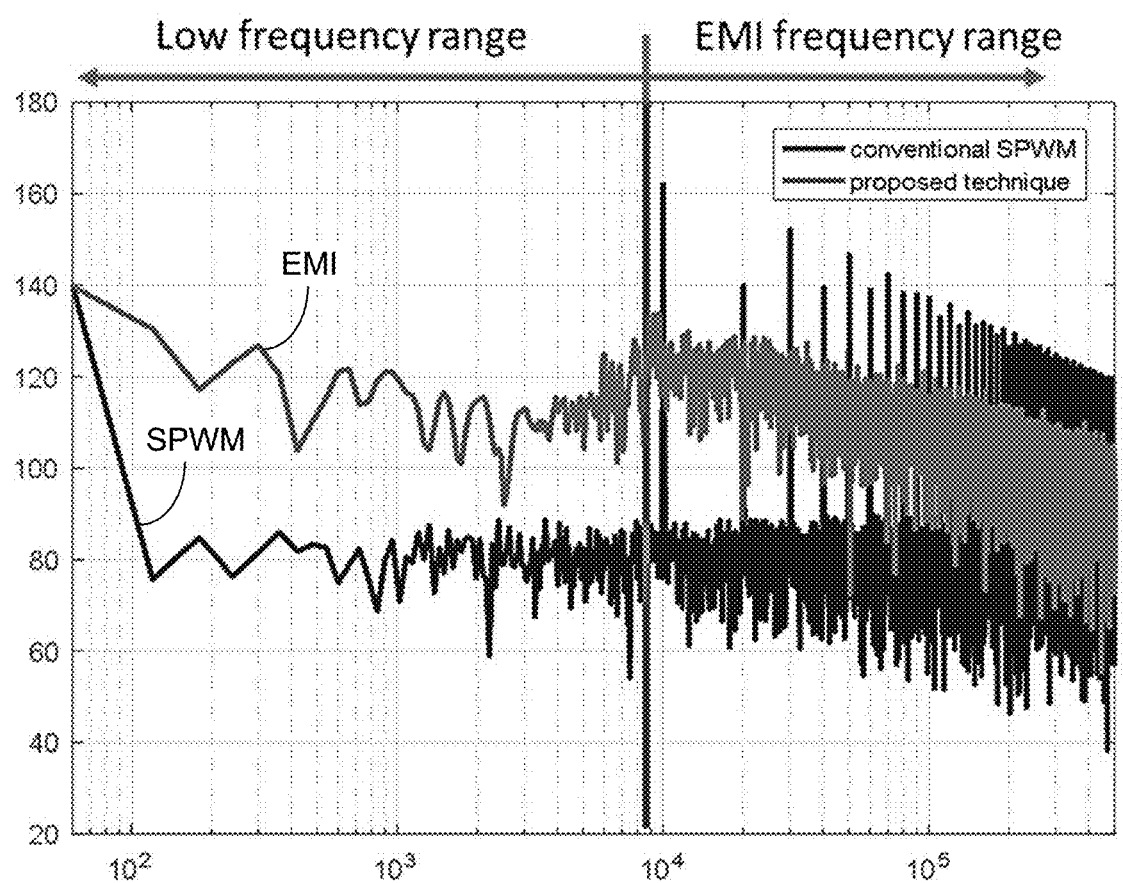

Experimental results are shown in FIG. 12 for both SPWM and the EMI energy mitigation technique with the y-axis as a log scale. The testing was carried out with a switching frequency of 10 kHz. The convention SPWM spectrum shows that the energy is concentrated at each switching harmonic (10 kHz, 20 kHz, . . . ). The magnitude of SPWM components is high in measurement. With the disclosed EMI energy mitigation technique, the switching harmonics are dispersed in a lower frequency range below 9 kHz that is EMI standard free. As shown in FIG. 12, the harmonic components produced using the EMI energy mitigation technique are high in lower frequency range, while those for SPWM are lower or nonexistent. It should be noted that the EMI energy mitigation technique doesn't change the fundamental magnitude at 60 Hz, which means that the operation of the inverter will not be influenced. In the EMI frequency range, the magnitude of the EMI energy mitigation technique can achieve a maximum 30 dB attenuation compared with conventional SPWM control. Moreover, in a higher switching frequency application, the attenuation could be even larger, since there is more "space" available for energy dispersion. Furthermore, existing software techniques usually can achieve an EMI reduction around 10 dB. So, the EMI energy mitigation technique has a noted advantage over those software techniques.

Figure 13:
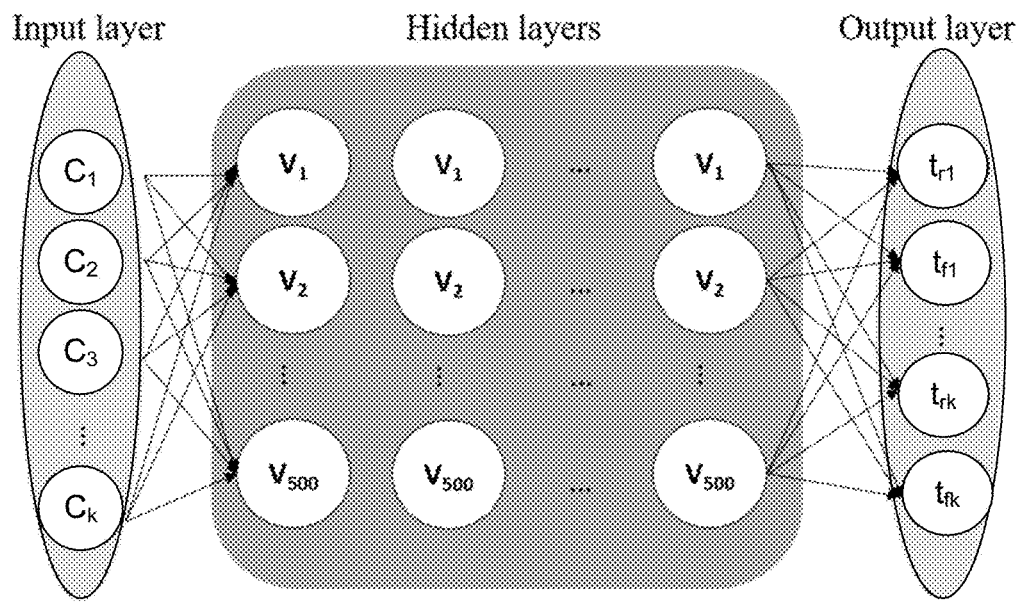
FIG. 13 illustrates an artificial neural network for calculating switching angles to achieve minimal errors for EMI reduction, in accordance with various embodiments of the present disclosure.

In various embodiment, systems and methods of the present disclosure incorporate an artificial neural network to enhance the generation of switching angles. Accordingly, the training data for the artificial neural network can be obtained from data obtained from the methods illustrated in FIG. 8, in which the artificial neural network can generate new switching angles at a faster speed and thus improve the real-time control performance. For example, when the number of switching angles is large, the solving of high order non-linear equations involves a lot of computations which influence the real-time control performance. Accordingly, in order to improve the real-time control performance of the EMI energy mitigation technique, an artificial neural network (ANN), as illustrated in FIG. 13, can be applied in order to generate the switching angles based on an objective EMI spectrum. As shown in FIG. 13, operational harmonic magnitudes ($C_i$) can be applied to neuron vectors ($V_j$) to determine determined switching angles (e.g., rising times ($t_r$) and falling times ($t_f$)) of the switching circuit, in accordance with various embodiments of the present disclosure.

In one embodiment, the ANN is implemented using Keras and the training data for the ANN is obtained from data obtained from the methods illustrated in FIG. 8. Considering the accuracy and calculation time, in an exemplary implementation, the input layer of the ANN has 401 units, which includes average duty cycle and first 400 harmonics; and there are 10 hidden layers, in which each hidden layer has 500 units. It should be noted that the parameters can be different in various cases since the input and output variables number can be different. In various embodiments, the selection of the parameters is based on empirical cases (trial and error). Each neuron $V_j$ comes from the former layer's output with weight coefficient $w_i$ and bias, as defined by Equation (8):

$$V_j = \sum_{i=1}^{n} (w_i C_i) + \text{bias} \qquad (8)$$

In various embodiments, mean square error (MSE) can be used to evaluate the accuracy between the ANN's prediction output and original accurate output.

Figure 14:
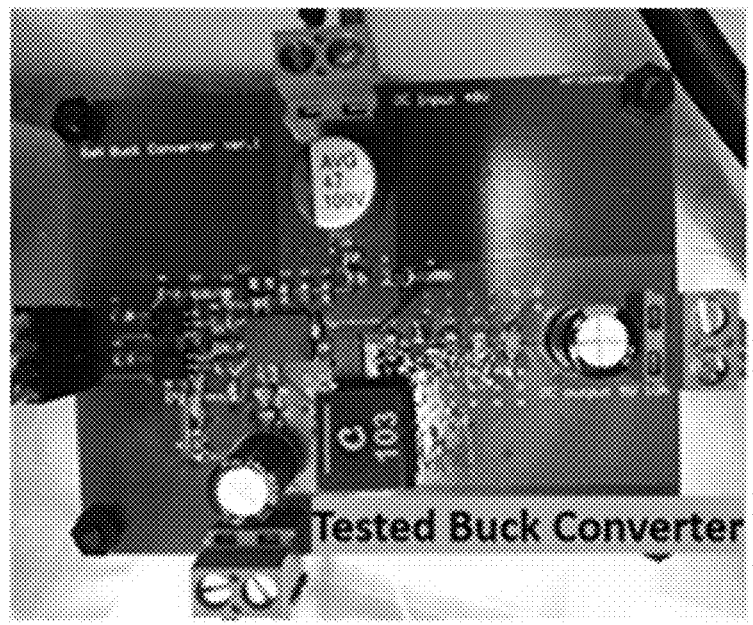
FIG. 14 illustrates a buck converter circuit that is used to evaluate EMI noise of an exemplary technique for EMI reduction, in accordance with embodiments of the present disclosure, with a conventional PWM technique.
Figure 15A:
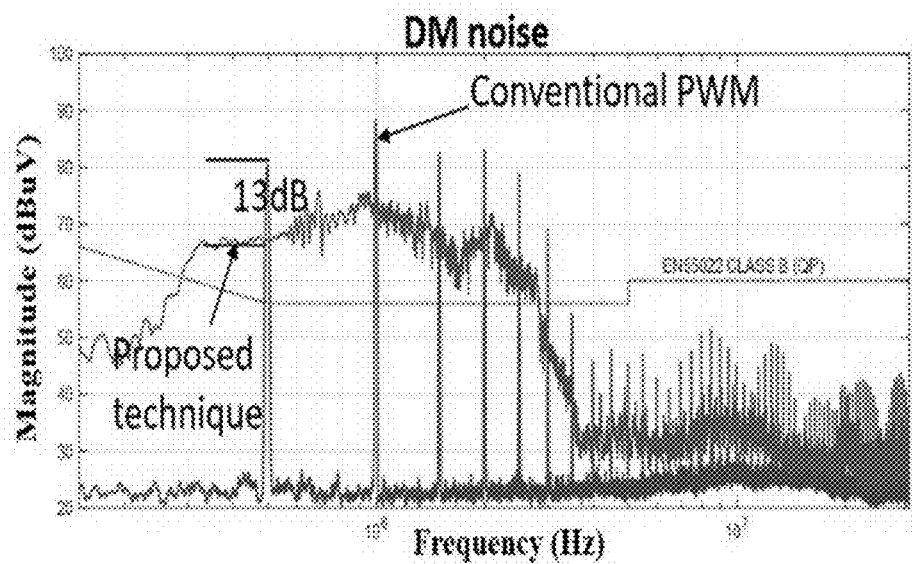
FIGS. 15A and 15B illustrate an EMI noise comparison between an exemplary technique for EMI reduction, in accordance with embodiments of the present disclosure, and a conventional PWM technique for both DM noise and CM noise.
Figure 15B:
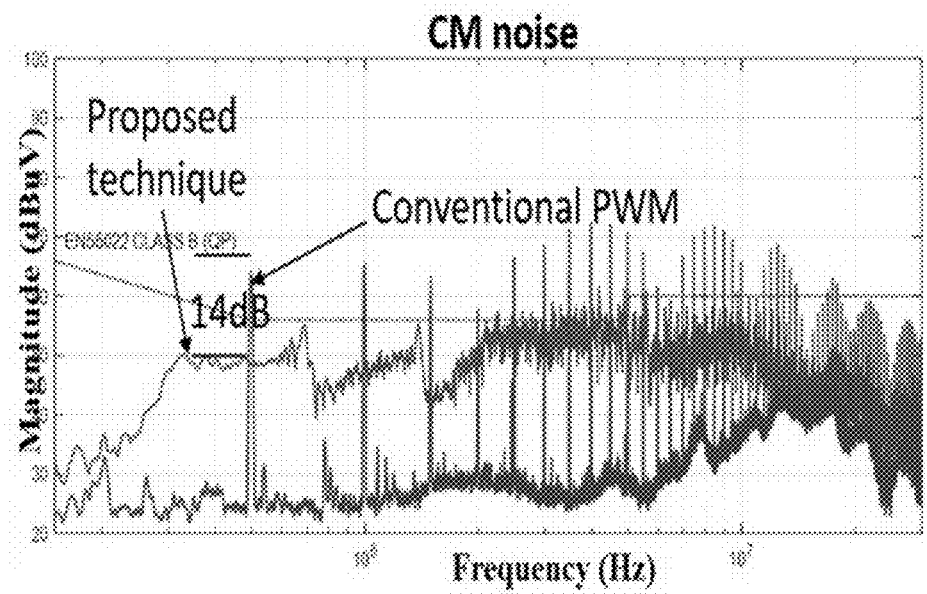

Accordingly, to evaluate the feasibility of an exemplary system and method for electromagnetic interference energy mitigation utilizing an artificial neural network, the EMI noise of such an exemplary technique ("Proposed technique") is measured and compared with conventional PWM in the buck converter of FIG. 14 and presented in FIGS. 15A and 15B respectively, in which both DM (differential-mode) noise (FIG. 15A) and CM (common-mode) noise (FIG. 15B) are measured. From the figures, both CM and DM noise are shown to be reduced with the exemplary system/method for electromagnetic interference energy mitigation utilizing an artificial neural network.

Figure 16:
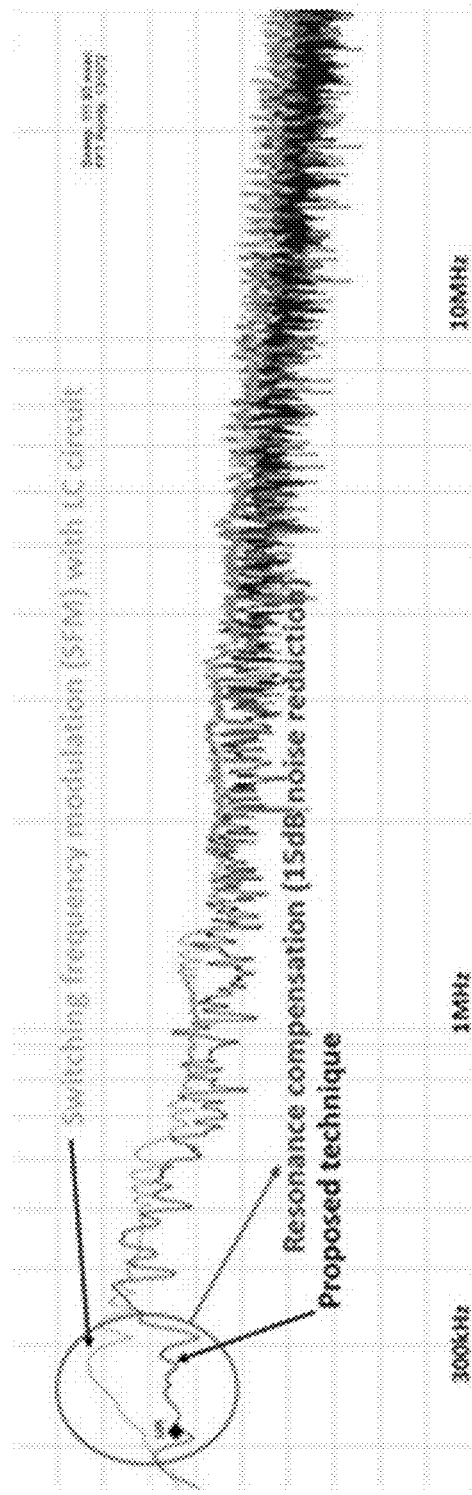
FIG. 16 illustrates that an EMI spectrum can be reduced, as compared against a conventional SFM technique, and that EMI noise can be reduced by 15 dB, in accordance with various embodiments of the present disclosure.

Another benefit of the exemplary technique is that, by controlling the EMI spectrum energy in 150 kHz to 30 MHz, the EMI spectrum in the frequency domain can be reshaped and the circuit resonances can be compensated which improve the system's EMI performance. So, exemplary techniques of the present disclosure are more flexible in EMI spectrum control as compared with conventional switching frequency modulation (SFM) techniques. For example, if we suppose a circuit resonance happens at 270 kHz, which leads to a small impedance, the EMI spectrum will correspondingly have a peak noise at 270 kHz with a conventional SFM. With an exemplary technique of the present disclosure to compensate the resonance at 270 kHz, the spectrum can be reduced as compared against a conventional SFM technique and the EMI noise can be reduced by 15 dB in accordance with various embodiments of the present disclosure, as shown in FIG. 16.

In various embodiments, a system in accordance with the present disclosure, among others, comprises a switching circuit comprising an array of semiconductor switches that control application of a voltage source to a load; a controller circuitry configured to control switching of the array of semiconductor switches by adjusting switching angles of the switching circuit based on resolution bandwidths (RBWs) associated with an electromagnetic interference (EMI) frequency spectrum of the switching circuit and weight coefficients of the RBWs; and the controller circuitry being further configured to process, using an artificial neural network, harmonic magnitudes ($C_i$) produced by the switching angles to determine the adjusted switching angles for the switching circuit based on the resolution bandwidths (RBWs) associated with the electromagnetic interference (EMI) frequency spectrum of the switching circuit and the weight coefficients of the RBW.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method for electromagnetic interference energy mitigation, comprising:
    determining electromagnetic interference (EMI) spectrum information based upon switching angles of a switching circuit, the EMI spectrum information comprising harmonic magnitudes ($C_i$) associated with the switching angles;
    processing the harmonic magnitudes ($C_i$) using an artificial neural network to determine adjusted switching angles for the switching circuit based on resolution bandwidths (RBWs) associated with the electromagnetic interference (EMI) spectrum of the switching circuit and weight coefficients of harmonics associated with the RBWs; and
    applying the adjusted switching angles to control the switching circuit thereby reducing generated EMI energy by the switching circuit.

2. The method of claim 1, wherein only one significant harmonic of an EMI frequency spectrum is within each RBW.

3. The method of claim 2, wherein each RBW is associated with weight coefficients comprising a middle weight coefficient corresponding to one significant harmonic in the RBW and other weight coefficients, and the middle weight coefficient is smaller than the other weight coefficients in the RBW to reduce the one significant harmonic.

4. The method of claim 1, comprising determining training data for the artificial neural network comprising a first set of operational harmonic magnitudes associated with first adjusted switching angles, wherein the first adjusted switching angles are adjusted in response to a comparison of a maximum weighted error and a preset tolerance threshold, the maximum weighted error determined from errors between reference harmonic magnitudes ($C_i^*$) associated with the RBWs and the operational harmonic magnitudes ($C_i$) determined using the switching angles of the switching circuit, where the errors between $C_i$ and $C_i^*$ are weighted by corresponding weight coefficients of the RBWs.

5. The method of claim 4, comprising determining revised adjusted switching angles for the switching circuit in response to the maximum weighted error exceeding the preset tolerance threshold, wherein at least a portion of the errors between $C_i$ and $C_i^*$ are reduced by the revised adjusted switching angles.

6. The method of claim 5, wherein the RBWs are defined based upon an EMI standard limiting the harmonics associated with the RBWs.

7. The method of claim 5, comprising training the artificial neural network using the training data to generate new adjusted switching angles for the switching circuit.

8. The method of claim 1, comprising applying a DC offset to a modulation waveform to change an average duty cycle of the switching circuit.

9. The method of claim 1, wherein the switching angles correspond to rise and fall times of switches in the switching circuit.

10. A system, comprising:
    a switching circuit comprising an array of semiconductor switches that control application of a voltage source to a load;
    controller circuitry configured to control switching of the array of semiconductor switches by adjusting switching angles of the switching circuit based on resolution bandwidths (RBWs) associated with an electromagnetic interference (EMI) frequency spectrum of the switching circuit and weight coefficients of the RBWs; and
    the controller circuitry further configured to process, using an artificial neural network, harmonic magnitudes ($C_i$) associated with the switching angles to determine the adjusted switching angles for the switching circuit based on the resolution bandwidths (RBWs) associated with the electromagnetic interference (EMI) frequency spectrum of the switching circuit and the weight coefficients of the RBW.

11. The system of claim 10, wherein the RBWs are associated with pass-bands of intermediate frequency (IF) filters.

12. The system of claim 11, comprising EMI filters having stop bands corresponding to one or more of the RBWs.

13. The system of claim 11, wherein the controller circuitry is configured to process training data using the artificial neural network to generate new adjusted switching angles, wherein the training data comprises a first set of operational harmonic magnitudes ($C_i$) associated with first adjusted switching angles, wherein the first adjusted switching angles are adjusted in response to a comparison of a maximum weighted error and a preset tolerance threshold, the maximum weighted error determined from errors between reference harmonic magnitudes ($C_i^*$) associated with the RBWs and the operational harmonic magnitudes ($C_i$) determined using the switching angles of the switching circuit, where the errors between $C_i$ and $C_i^*$ are weighted by corresponding weight coefficients of the RBWs.

14. The system of claim 10, wherein the switching angles correspond to rise and fall times of switches in the switching circuit.

15. The system of claim 10, wherein the controller circuitry is configured to adjust an average duty cycle of the switching circuit to control a total energy of the switching circuit.

16. The system of claim 11, wherein the RBWs are defined based upon an EMI standard limiting the harmonics associated with the RBWs.

17. A method for electromagnetic interference energy mitigation, comprising:
 determining electromagnetic interference (EMI) spectrum information based upon switching angles of a switching circuit, the EMI spectrum information comprising determined harmonic magnitudes ($C_i$) associated with the switching angles;
 determining weighted errors corresponding to differences between reference harmonic magnitudes ($C_i^*$) and the determined harmonic magnitudes ($C_i$);
 in response to a comparison of a maximum weighted error of the weighted errors to a preset tolerance threshold, determining adjusted switching angles for the switching circuit,
 processing, using an artificial neural network, training data to determine new adjusted switching angles for the switching circuit, wherein the training data comprises harmonic magnitudes associated with the determined adjusted switching angles; and
 applying the new adjusted switching angles to control the switching circuit thereby reducing generated EMI energy by the switching circuit.

18. The method of claim 17, wherein the weighted errors are determined by weighting errors between a reference harmonic magnitude and a corresponding determined harmonic magnitude with a corresponding weight coefficient.

19. The method of claim 17, wherein the switching angles correspond to rise and fall times of switches in the switching circuit.

20. The method of claim 17, comprising adjusting an average duty cycle of the switching circuit to control a total energy of the switching circuit.

* * * * *